(12) United States Patent
Park

(10) Patent No.: US 7,884,476 B2
(45) Date of Patent: Feb. 8, 2011

(54) SEMICONDUCTOR DEVICE

(75) Inventor: Keun Soo Park, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 186 days.

(21) Appl. No.: 12/364,228

(22) Filed: Feb. 2, 2009

(65) Prior Publication Data

US 2009/0134519 A1 May 28, 2009

Related U.S. Application Data

(62) Division of application No. 11/609,887, filed on Dec. 12, 2006, now Pat. No. 7,504,334.

(30) Foreign Application Priority Data

Dec. 28, 2005 (KR) .................... 10-2005-0132008

(51) Int. Cl.
*H01L 23/485* (2006.01)

(52) U.S. Cl. .................... 257/751; 257/774; 257/763; 257/E23.019

(58) Field of Classification Search ................. 257/751, 257/774, 763, E23.019
See application file for complete search history.

(56) References Cited

U.S. PATENT DOCUMENTS 6,835,648 B2  12/2004  Hong et al.

*Primary Examiner*—Roy K Potter
(74) *Attorney, Agent, or Firm*—Sherr & Vaughn, PLLC

(57) ABSTRACT

Embodiments relate to a semiconductor device. In embodiments, the semiconductor device may include a semiconductor substrate having a first metal line; a pre-metal dielectric (PMD) layer over the first metal line on the semiconductor substrate; a first metal layer formed in a first contact hole in the PMD layer; a second metal layer formed in a second contact hole in the PMD layer; and a second metal line electrically connected to the first and second metal layers, respectively, over the PMD layer, wherein the first and second metal layers are located at prescribed positions and configured to be electrically connected to the first metal line.

20 Claims, 13 Drawing Sheets

SEMICONDUCTOR DEVICE

The present application is a divisional of U.S. patent application Ser. No. 11/609,887 (filed on Dec. 12, 2006) now U.S. Pat. No. 7,504,334, which claims priority under 35 U.S.C. 119 and 35 U.S.C. 365 to Korean Patent Application No. 10-2005-0132008 (filed on Dec. 28, 2005), both of which are hereby incorporated by reference in their entirety.

BACKGROUND

In semiconductor devices, a metal interconnection may be connected to an upper portion of a metal line formed on a semiconductor substrate, and may apply an electric signal to a semiconductor device. Such connection may be achieved through a contact hole.

In a multi-layered interconnection structure, metal interconnection layers and insulating layers may alternately be formed on the semiconductor substrate. Metal interconnection layers, which may be isolated from each other by the insulating layers, may be electrically connected to each other, for example through via holes so that circuits can be operated.

A related art method of forming a metal interconnection of a semiconductor device will be described with reference to accompanying drawings.

FIGS. 1A to 1F are example sectional diagrams illustrating a related art procedure for forming the metal interconnection of a semiconductor device.

Referring to FIG. 1A, first metal line 4 may be formed on semiconductor substrate 2 including a structure (not shown) formed through a known semiconductor manufacturing process. Pre-metal dielectric (PMD) layer 6 may be formed on a surface, for example the entire top surface, of semiconductor substrate 2 including first metal line 4. PMD layer 6 may be planarized, for example through a chemical mechanical polishing (CMP) process.

Referring to FIG. 1B, a photoresist film may be coated on PMD layer 6, and then subjected to an exposure and development process. Photoresist film pattern 8 that may expose a prescribed portion of PMD layer 6 may thereby be formed.

Referring to FIG. 1C, exposed PMD layer 6 may be dry-etched by, for example using photoresist film pattern 8 as a mask. Contact hole 10 may thereby be formed, which may expose a part of metal line 4. Photoresist layer pattern 8 may then be removed.

Referring to FIG. 1D, barrier metal layer 12 may be shallowly deposited on an entire surface of a PMD layer 6a including an inner wall of contact hole 10. Metal layer 14 may be formed on barrier metal layer 12 in such a manner that contact hole 10 may be filled with metal layer 14.

Referring to FIG. 1E, barrier metal layer 12 and metal layer 14 may be planarized through the CMP process until a surface of PMD layer 6a is exposed.

Referring to FIG. 1F, second metal line pattern 16 may be formed on PMD layer 6a, barrier metal layer 12a, and metal layer 14a. The metal interconnection of a semiconductor device may thereby be formed.

A related art semiconductor and related methods may have various problems. For example, when forming a metal interconnection of the semiconductor device according to the related art, since the metal interconnection of the semiconductor device may be formed according to a predetermined design, a number of metal interconnections may need to be increased to operate the semiconductor device under a high voltage level as may be required by a user. Such an increase of the metal interconnections may raise a failure rate of a semiconductor device.

In addition, since the metal interconnections of a related art semiconductor device may be formed according to a predetermined design, it may be difficult to manufacture semiconductor devices that may be required by each individual user.

SUMMARY

Embodiments relate to a semiconductor device.

According to embodiments, a semiconductor device may include a semiconductor substrate having a first metal line; a pre-metal dielectric (PMD) layer over the first metal line on the semiconductor substrate; a first metal layer formed in a first contact hole in the PMD layer; a second metal layer formed in a second contact hole in the PMD layer; and a second metal line electrically connected to the first and second metal layers, respectively, over the PMD layer, wherein the first and second metal layers are located at prescribed positions and configured to be electrically connected to the first metal line.

According to embodiments, a semiconductor device may include a semiconductor substrate having a first metal line; a pre-metal dielectric (PMD) layer over the first metal line on the semiconductor substrate; a metal layer formed in the PMD layer; a silicon layer in the PMD layer; a second metal line electrically connected to the metal layer and the silicon layer, respectively, over the PMD layer, the second metal line including a first metal pattern electrically connected to the metal layer and a second metal pattern electrically connected to the silicon layer.

According to embodiments, semiconductor device may include a PMD layer over a first metal line on a semiconductor substrate;

a first metal layer at a prescribed position in the PMD layer and electrically connected to the first metal line; a second metal layer at a prescribed position in the PMD layer and electrically connected to the first metal line; a second metal line electrically connected to the first and second metal layers, respectively, over the PMD layer, the second metal line including a first metal pattern electrically connected to the first metal layer and a second metal pattern electrically connected to the second metal layer.

DETAILED DESCRIPTION OF EMBODIMENTS

Figure 1A:
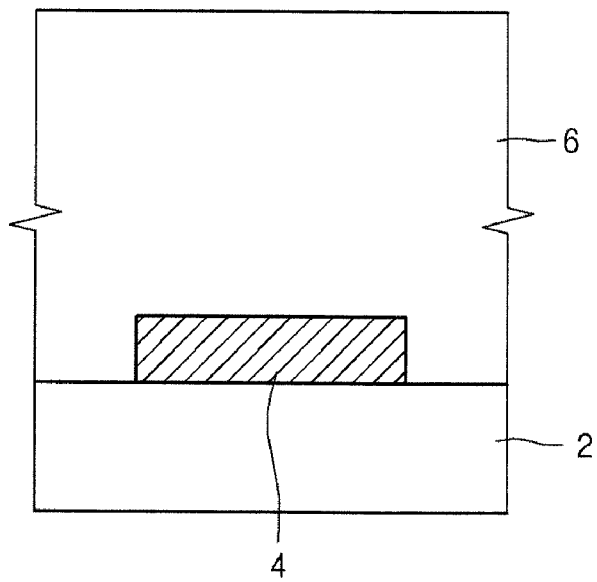
FIGS. 1A to 1F are example sectional diagrams illustrating a related art procedure for manufacturing a metal interconnection of a semiconductor device.
Figure 1B:
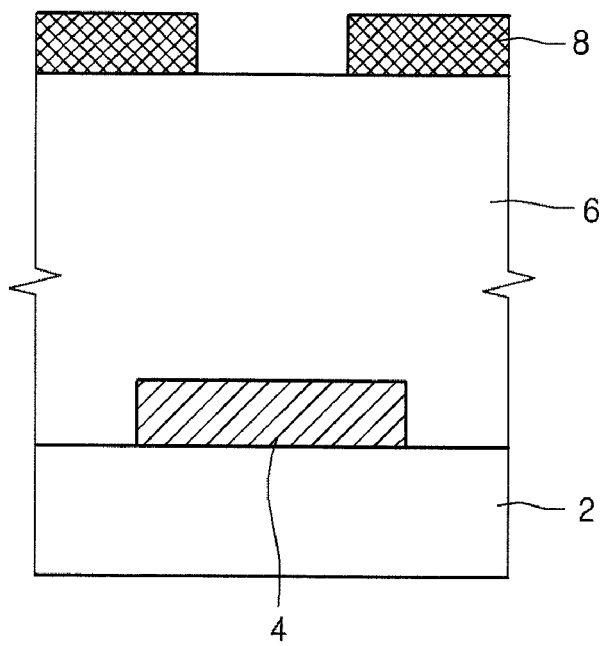
Figure 1C:
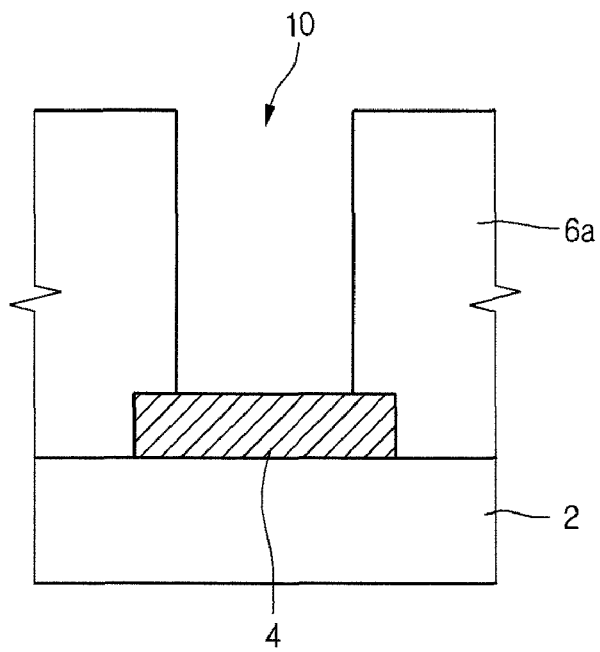
Figure 1D:
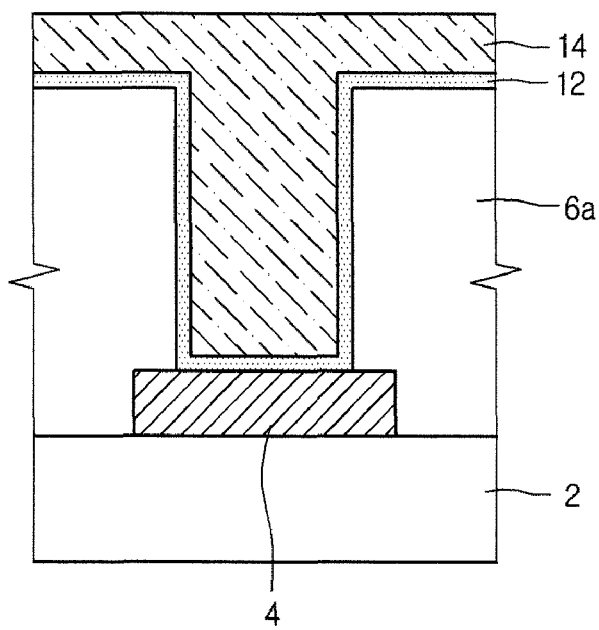
Figure 1E:
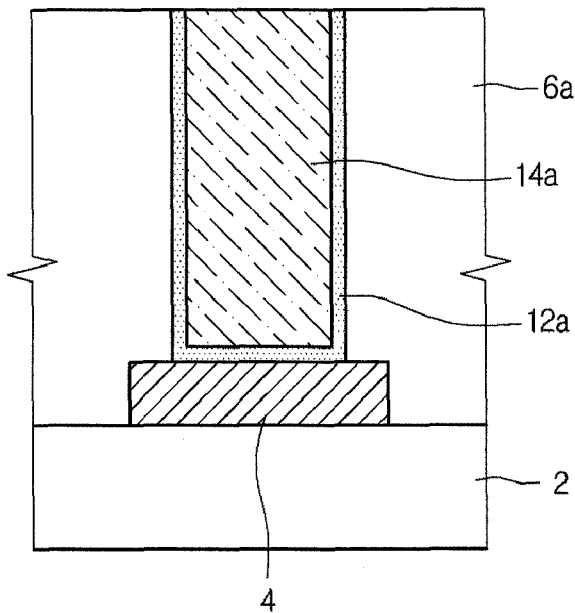
Figure 1F:
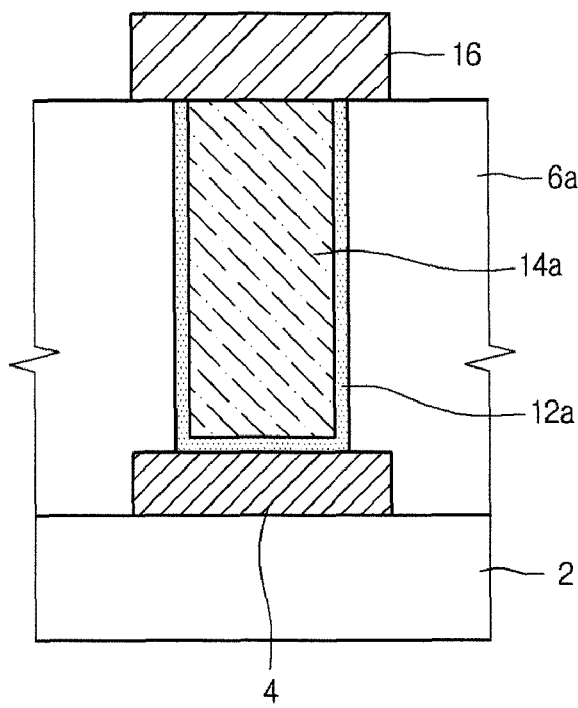
Figure 2A:
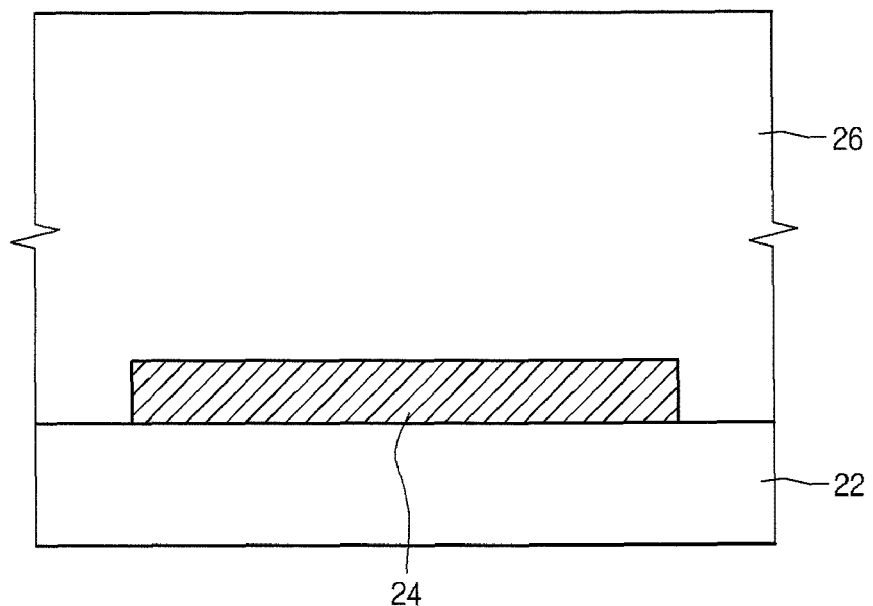
FIGS. 2A to 2K are example sectional diagrams illustrating a semiconductor device and a procedure for manufacturing a semiconductor device according to embodiments.

Referring to FIG. 2A, first metal line 24 may be formed on semiconductor substrate 22. PMD (Pre Metal Dielectric) layer 26 may be formed on a surface of semiconductor substrate 22 and first metal line 24. PMD layer 26 may be planarized, for example through a CMP (Chemical Mechanical Polishing) process.

Figure 2B:
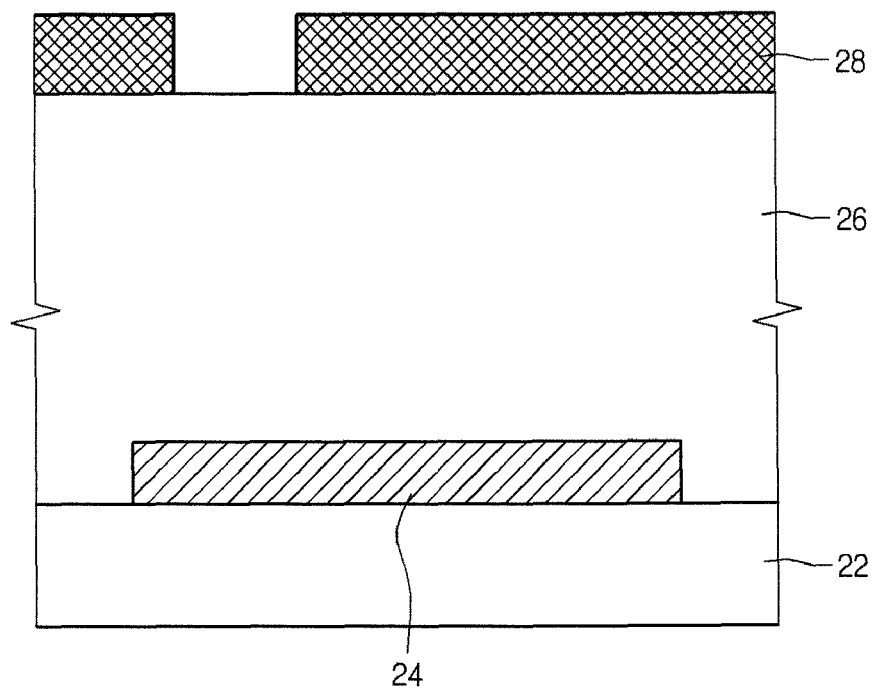

Referring to FIG. 2B, a photoresist film may be coated on PMD layer 26 and an exposure and development process may be performed with respect to the photoresist film. First photoresist film pattern 28 may thus be formed, and may expose a prescribed portion of PMD layer 26.

Figure 2C:
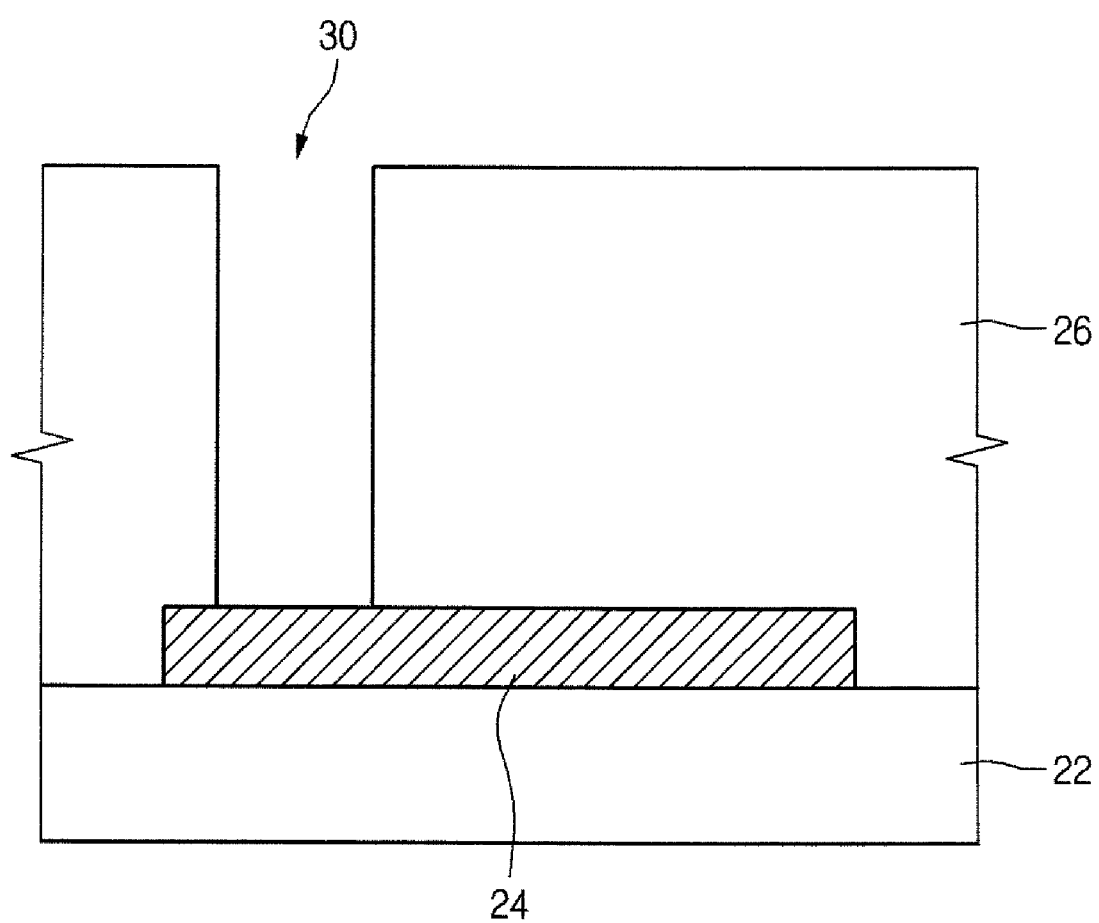

Referring to FIG. 2C, the exposed PMD layer 26 may be dry-etched, for example by using first photoresist film pattern 28 as an etch mask. First contact hole 30 made thus be formed, and may expose a part of metal line 24. First photoresist film pattern 28 may be removed.

Figure 2D:
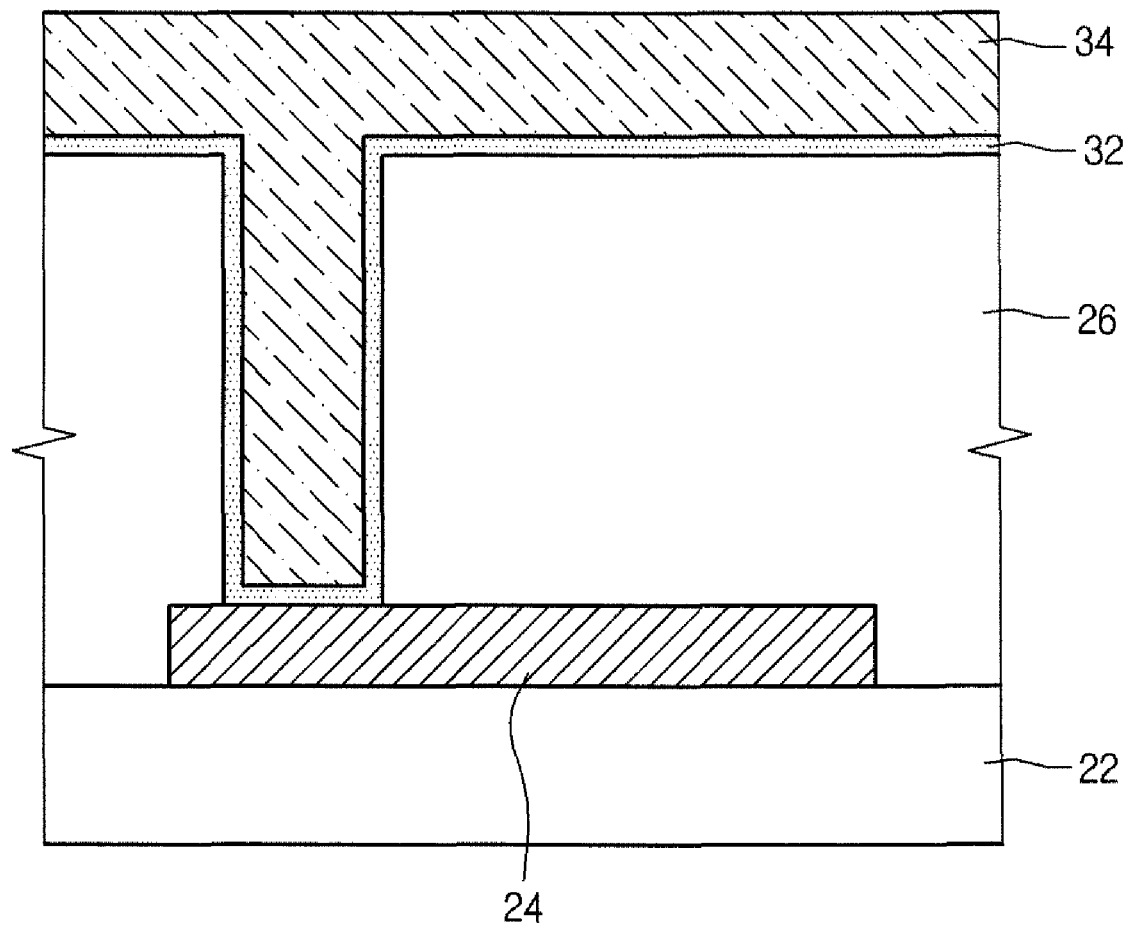

Referring to FIG. 2D, first barrier metal layer 32 may be shallowly deposited in first contact hole 30 and first metal layer 34 may be formed on first barrier metal layer 32. First contact hole 30 may thus be filled with first metal layer 34.

Figure 2E:
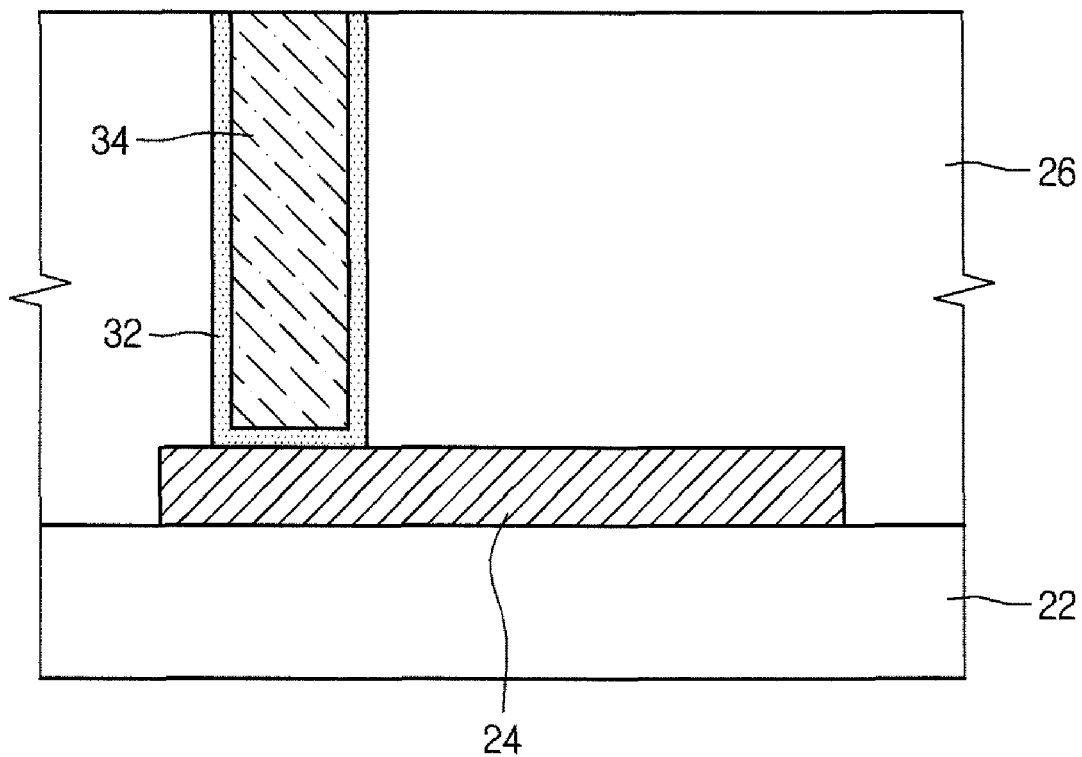

Referring to FIG. 2E, first barrier metal layer 32 and first metal layer 34 may be planarized, for example through a CMP process, and a surface of PMD layer 26 may be exposed.

In embodiments, the first barrier metal layer may be formed by using a metal, such as titanium, and the first metal layer may include tungsten.

Figure 2F:
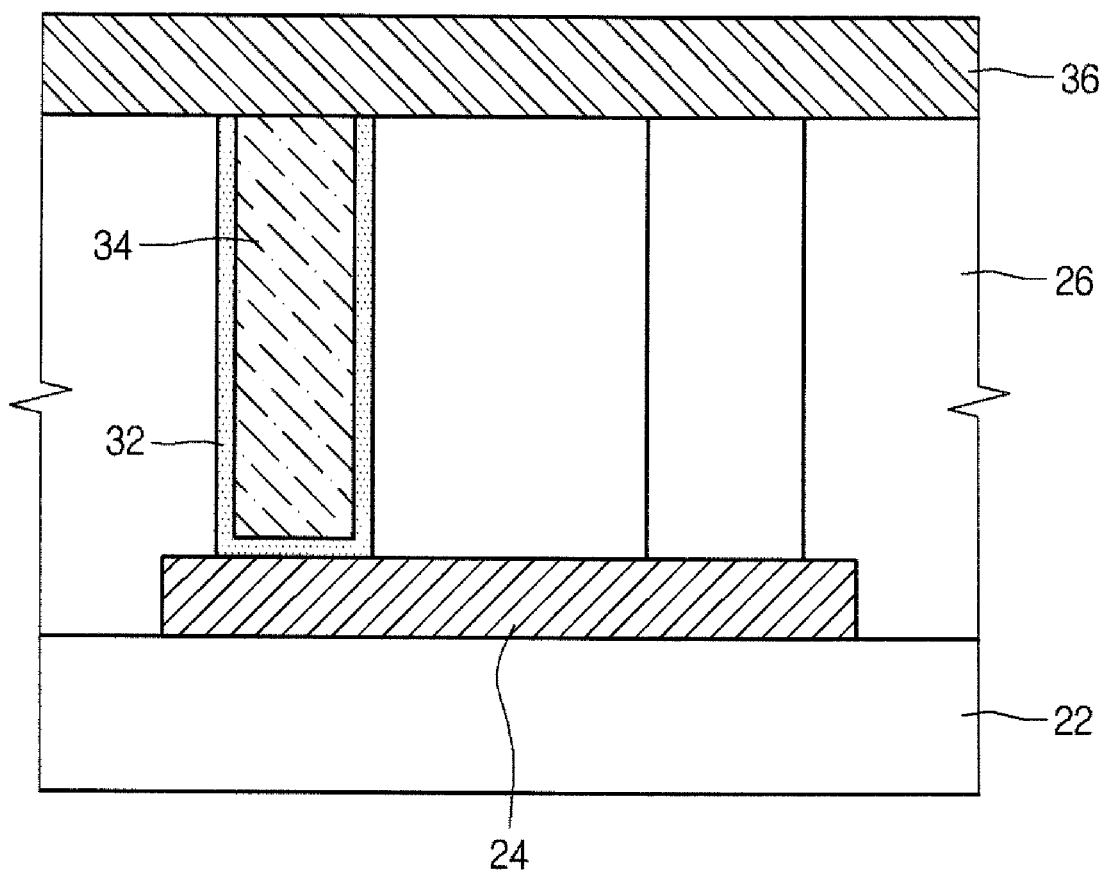

Referring to FIG. 2F, interlayer dielectric layer 36, which may include a nitride layer, may be formed on PMD layer 26, first barrier metal layer 32 and first metal layer 34.

Figure 2G:
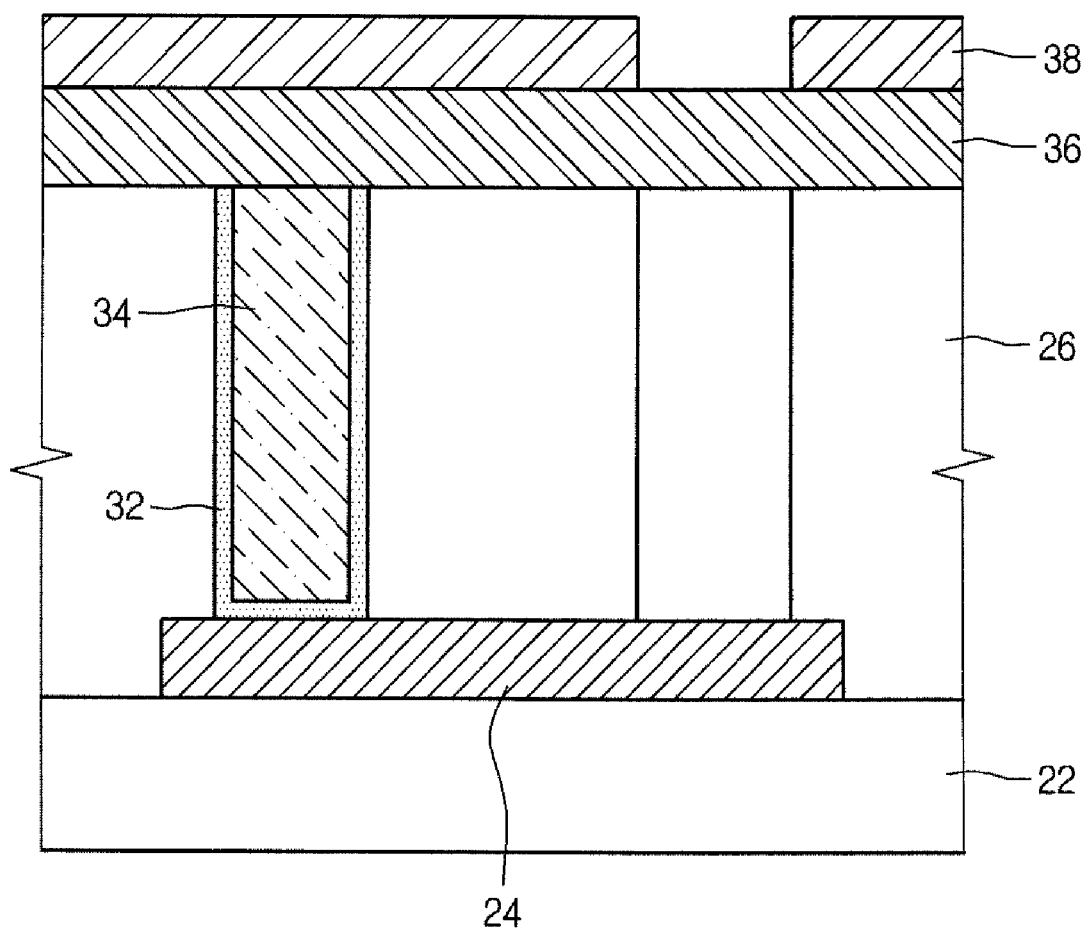

Referring to FIG. 2G, second photoresist film pattern 38 may be formed on interlayer dielectric layer 36 to expose a prescribed portion of interlayer dielectric layer 36.

Figure 2H:
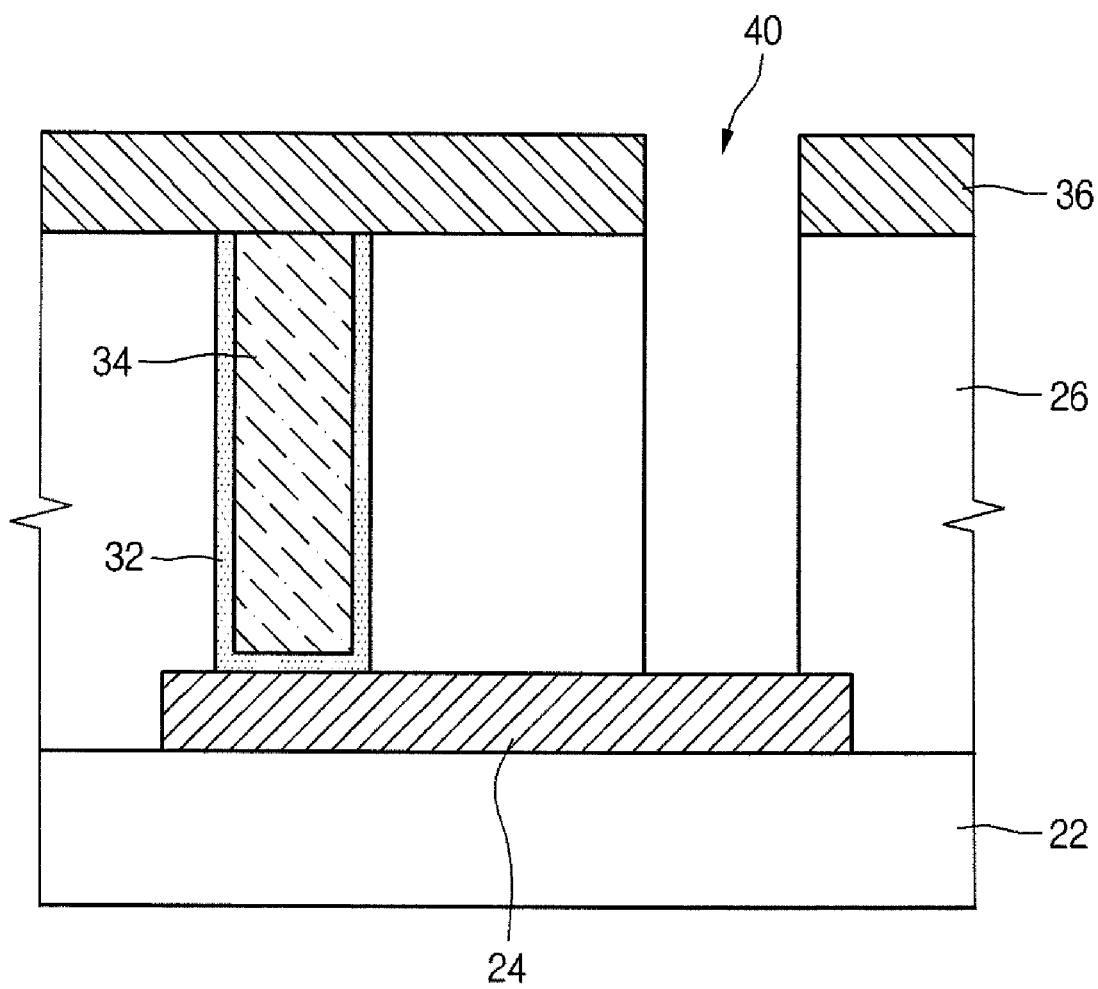

Referring to FIG. 2H, prescribed portions of insulating layer 36 and PMD layer 26a may be dry-etched, thereby forming second contact hole 40, which may expose a prescribed portion of first metal line 24.

Second photoresist film pattern 38 may be removed. According to embodiments, two (2) contact holes 30 and 40 may be formed in first metal line 24.

Figure 2I:
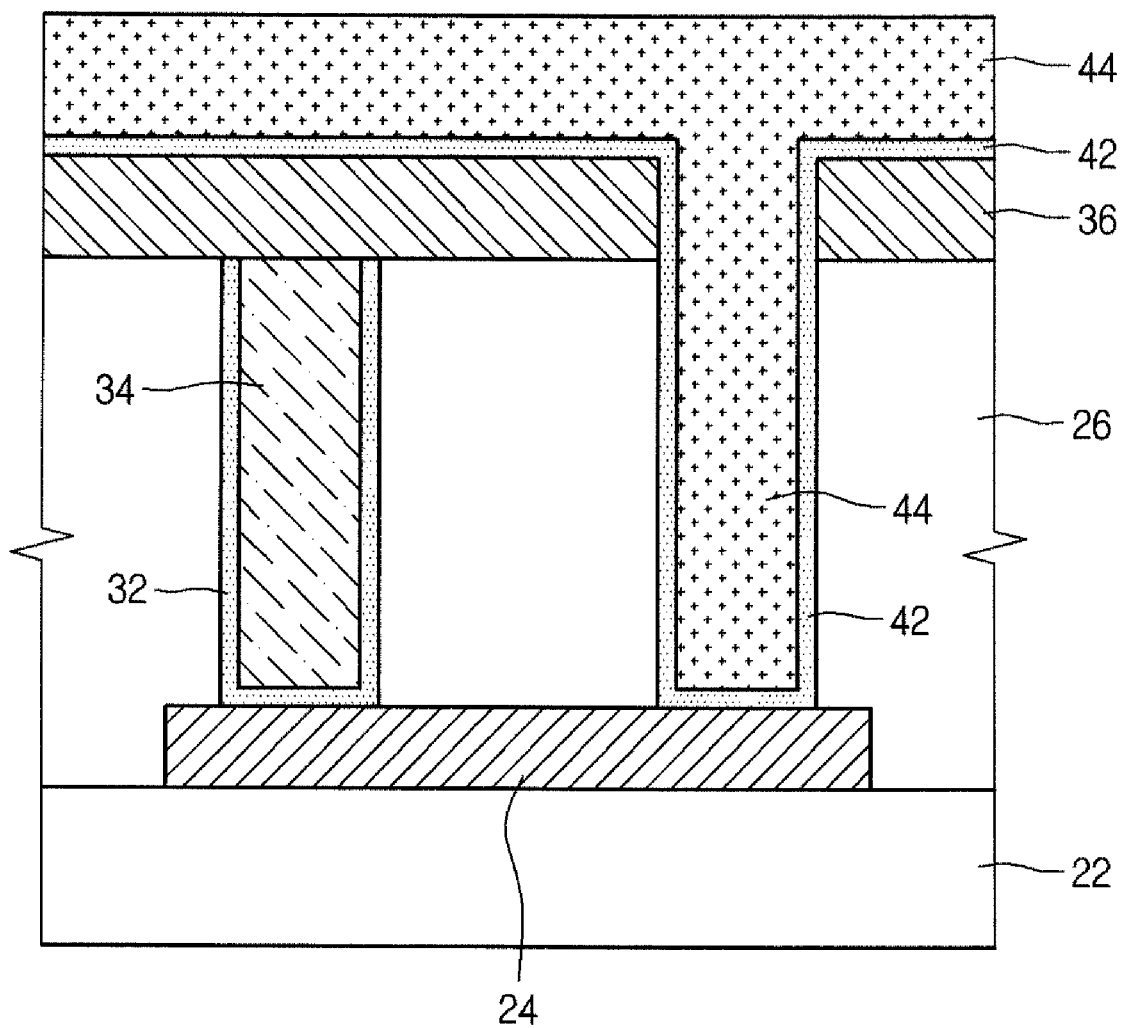

Referring to FIG. 2I, second barrier metal layer 42 may be shallowly deposited in second contact hole 40 and on interlayer dielectric layer 36. Silicon layer 44 may be formed on second barrier metal layer 42. Second contact hole 40 may thus be filled with silicon layer 44.

Figure 2J:
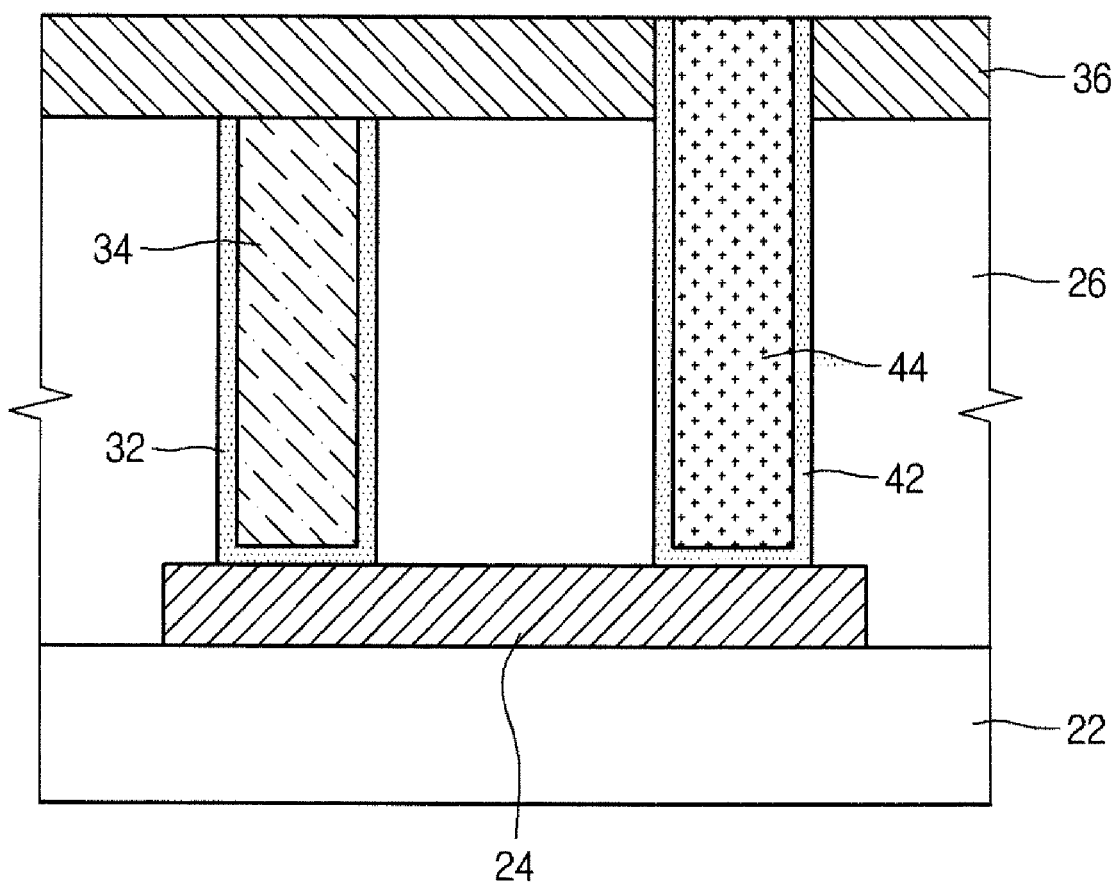

Referring to FIG. 2J, second barrier metal layer 42 and silicon layer 44 may be planarized, for example through a CMP process, and a surface of interlayer dielectric layer 36 may be exposed.

According to embodiments, second barrier metal 42 may include titanium, and silicon layer 44 may include amorphous silicon.

Figure 2K:
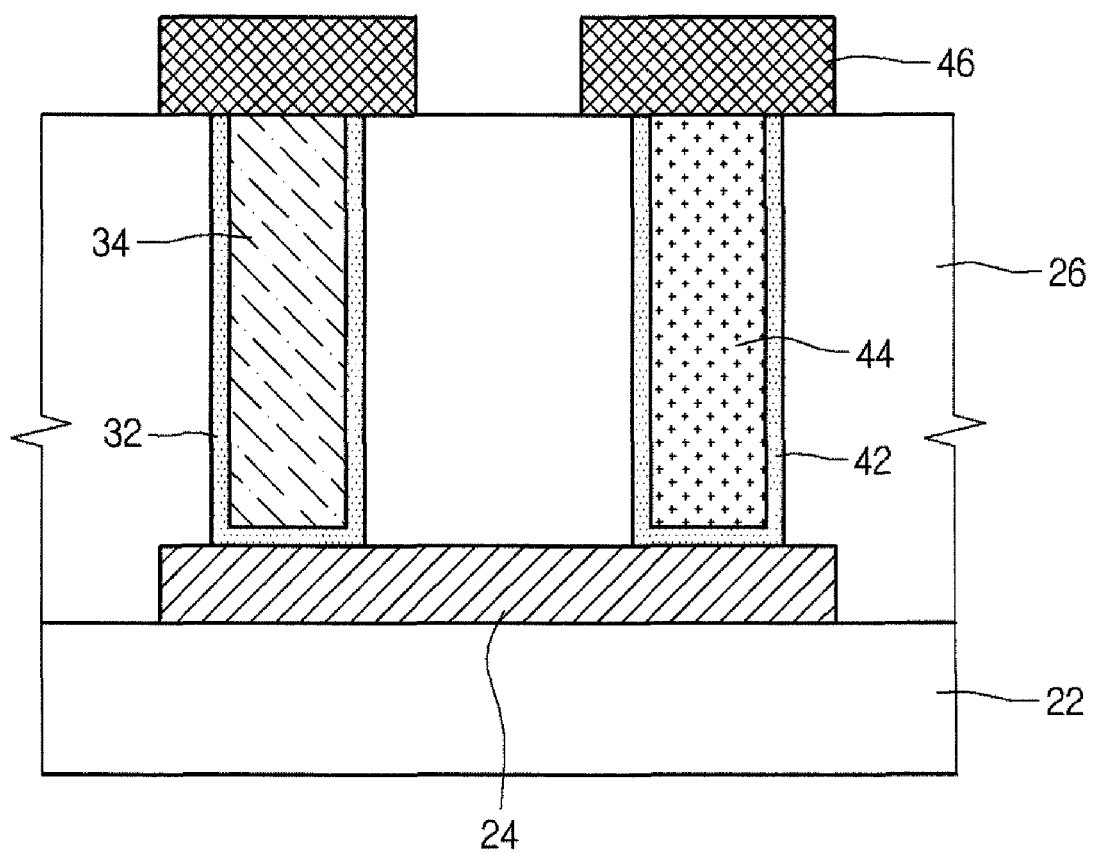

Referring to FIG. 2K, interlayer dielectric layer 36 may be removed from PMD layer 26. Second metal line 46, which may include a first metal connected to first metal layer 34 and a second metal connected to second metal layer 44, may be formed.

In embodiments, second metal line 46 may include a first metal pattern to be electrically connected to first metal layer 34 and a second metal pattern that may be electrically connected to second metal layer 44.

In embodiments, second contact hole 40 may be formed by etching the insulating layer 36 and PMD layer 26 after forming insulating layer 36 on PMD layer 26 and second photoresist film pattern 38 on the insulating layer 36. In embodiments, second contact hole 40 may be formed by etching PMD layer 26 after directly forming the photoresist film pattern 38 on PMD layer 26.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device comprising:
a semiconductor substrate having a first metal line;
a pre-metal dielectric (PMD) layer over the first metal line on the semiconductor substrate;
a first metal layer formed in a first contact hole in the PMD layer;
a second metal layer formed in a second contact hole in the PMD layer; and
a second metal line electrically connected to the first and second metal layers, respectively, over the PMD layer, wherein the first and second metal layers are located at prescribed positions and configured to be electrically connected to the first metal line.

2. The device of claim 1, wherein the first and second metal layers are electrically connected to the first metal line.

3. The device of claim 1, wherein the second metal layer comprises amorphous silicon.

4. The device of claim 1, wherein the first metal layer comprises tungsten.

5. The device of claim 1, wherein the second metal layer comprises a first metal pattern electrically connected to the first metal layer and a second metal pattern electrically connected to the second metal layer.

6. The device of claim 1, wherein a first barrier metal layer is formed between the first contact hole and the first metal layer.

7. The device of claim 1, wherein a second barrier metal layer is formed between the second contact hole and the second metal layer.

8. The device of claim 6, wherein the first barrier metal layer comprises titanium.

9. The device of claim 7, wherein the second barrier metal layer comprises titanium.

10. The device of claim 6, wherein the first barrier metal layer is electrically connected to the first metal line.

11. The device of claim 7, wherein the second barrier metal layer is electrically connected to the first metal line.

12. The device of claim 1, wherein a nitride layer is formed on the PMD layer before the second contact hole is formed, wherein the second contact hole is formed by simultaneously etching the PMD layer and the nitride layer.

13. A device comprising:
a semiconductor substrate having a first metal line;
a pre-metal dielectric (PMD) layer over the first metal line on the semiconductor substrate;
a metal layer formed in the PMD layer;
a silicon layer in the PMD layer;
a second metal line electrically connected to the metal layer and the silicon layer, respectively, over the PMD layer, the second metal line including a first metal pattern electrically connected to the metal layer and a second metal pattern electrically connected to the silicon layer.

14. The device of claim 13, wherein:
a first barrier metal layer formed in a first contact hole in the PMD layer exposing a portion of the first metal line; and
the metal layer formed in the first contact hole and over the first barrier metal layer.

15. The device of claim 14, wherein:
an interlayer dielectric layer formed over the PMD layer including the first barrier metal layer and the metal layer;
a second barrier metal layer formed in the second contact hole in the interlayer dielectric layer in the PMD layer exposing a portion of the first metal line; and
the silicon layer formed in the second contact hole and over the second barrier metal layer.

16. The device of claim 13, wherein the metal layer is electrically connected to the first metal line.

17. The device of claim 13, wherein the first and second barrier metal layers comprise titanium.

18. The device of claim 13, wherein the silicon layer comprises amorphous silicon.

19. The device of claim 15, wherein the first and second barrier metal layers are electrically connected to the first metal line.

20. A device comprising:
 a PMD layer over a first metal line on a semiconductor substrate;
 a first metal layer at a prescribed position in the PMD layer and electrically connected to the first metal line;
 a second metal layer at a prescribed position in the PMD layer and electrically connected to the first metal line;
 a second metal line electrically connected to the first and second metal layers, respectively, over the PMD layer, the second metal line including a first metal pattern electrically connected to the first metal layer and a second metal pattern electrically connected to the second metal layer.

* * * * *